Jan. 29, 1974 T. HARASZTI 3,788,904

METHOD OF PRODUCING AN INTEGRATED SOLID STATE CIRCUIT

Filed Feb. 18, 1971

Inventors.
Tegze Haraszti
Rainer Grosholz
BY Spencer & Kaye
ATTORNEYS.

United States Patent Office 3,788,904
Patented Jan. 29, 1974

3,788,904

METHOD OF PRODUCING AN INTEGRATED SOLID STATE CIRCUIT

Tegze Haraszti, Heilbronn, and Rainer Grosholz, Heilbronn-Bockington, Germany, assignors to Licentia Patent-Verwaltungs-G.m.b.H., Frankfurt am Main, Germany Filed Feb. 18, 1971, Ser. No. 116,494
Claims priority, application Germany, Feb. 19, 1970, P 20 07 627.1
Int. Cl. H01l 7/44
U.S. Cl. 148—186 7 Claims

ABSTRACT OF THE DISCLOSURE

A method of producing an integrated solid state circuit containing a MOS field effect transistor and a diode including introducing into a semiconductor body of a first type of conductivity, a diode region of a second type of conductivity, introducing source and drain regions of the second type of conductivity into the semiconductor body with at least one of the source or drain regions projecting into the diode region and finally completing the diode.

BACKGROUND OF THE INVENTION

This invention relates to a method of producing an integrated solid state circuit containing a MOS field effect transistor and a diode.

SUMMARY OF THE INVENTION

According to the invention, there is provided a method of producing an integrated solid-state circuit which contains an MOS field effect transistor and a diode, comprising the steps of introducing into a semiconductor body of a first type of conductivity, a diode region of a second type of conductivity, introducing source and drain regions of a field effect transistor of said second type of conductivity into said semiconductor body with at least one of said source or drain region projecting into said diode region, and finally completing said diode by treatment of said diode region.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Basically the method of the invention consists in that there is first introduced into a semiconductor body of the first type of conductivity a first diode region of the second type of conductivity. The specific resistance of this diode region is selected so that the diode to be produced has a sufficiently high breakdown voltage for the particular field of application. The source and drain regions of the field effect transistors of the second type of conductivity then are introduced into the semiconductor body with a doping suitable for the required characteristic data of the transistors. At least one of these regions projects into the first diode region. Finally a heavily doped second region of the first type of conductivity is introduced into the first diode region of the second type of conductivity, or the first diode region is provided with a Schottky contact.

The method according to the invention is used, in particular, for producing dynamic logical combinations operated by clock pulses.

The important advantage of the method according to the invention consists in the fact that the finished product comprises diode regions which have been produced in an optimum manner in order to obtain the required diode characteristics, while the regions of the field effect transistors can be constructed independently of the diode regions so that the transistors also have the optimum transistor characteristics required. In addition, there is an internal electrical connection between the diodes and the transistors so that at least some of the component connections which would otherwise usually be present at the surface of the semiconductor body can be dispensed with.

Figure 1:
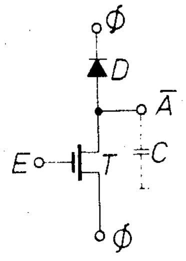
FIG. 1 is a circuit diagram of a basic unit of an integrated logic circuit in the production of which the method of the invention can be used.

Referring now to FIG. 1, an example of a basic unit of an integrated logic circuit is illustrated which can be produced by the method according to the invention. The basic unit, which is operated as an inverter, consists of a field effect transistor T and a diode D. The diode D has a p-n junction for example, or a metal-semiconductor junction. The diode is connected in series with the controlled current path of the field effect transistor. The input signal E which is to be negated and which corresponds to the information to be negated, appears at the input electrode for example. The phase clock pulse $\phi$, which consists of periodically repeated rectangular pulses, is applied to the other electrode of the field effect transistor, which is still free, as well as to the free electrode of the diode. For the sake of improved understanding, the charging capacitance C, which necessarily results with the said logical combination and therefore is not needed as a separate component, is shown in broken lines between the output electrode $\bar{A}$ and the ground electrode. This capacitance is charged during the operation of the circuit through a phase clock pulse and the diode D which is then conducting. After the end of the phase clock pulse, the charging voltage of the capacitance appears as a reverse voltage at the diode. Since the phase clock pulses have to be formed by the potential jump of about 12 to 15 volts, the diodes in the circuit must be able to withstand a corresponding reverse voltage. It is, of course, an additional requirement that the diode should not function as a transistor with the basic material of the integrated switching circuit.

Figure 2:
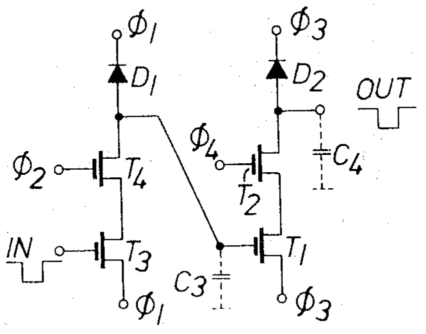
FIG. 2 is a circuit diagram of a further unit of an integrated logic circuit for which the method of the invention can be used.

Another circuit in which the method according to the invention can be used to advantage is illustrated in FIG. 2. FIG. 2 shows a shift register stage which consists of four MOS field effect transistors $T_1$ through $T_4$, where the controlled current paths of two of the transistors at a time are connected in series. A diode $D_1$ to $D_2$ is connected in series with each series connection consisting of two transistors. The capacitors $C_3$ and $C_4$ shown in broken lines are formed by the transistors themselves and are charged and discharged by phase clock pulses $\phi_1$ to $\phi_4$ succeeding one another in time, during the operation of the circuit. With this arrangement, the diodes are stressed in the reverse direction when the capacitances are charged, therefore, a high breakdown strength of the diodes is required because of the high potential differences for the phase clock pulses.

The method according to the invention is explained in more detail with reference to FIGS. 3 to 5.

Figure 3:
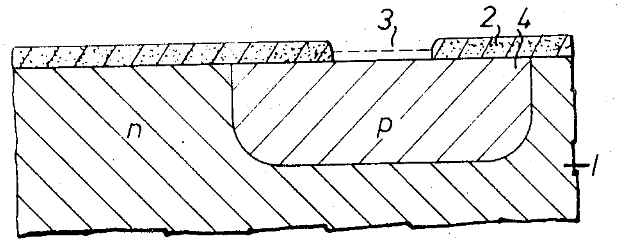
FIG. 3 is a sectional view of a semiconductor body showing a first stage of the method of the invention.
Figure 4:
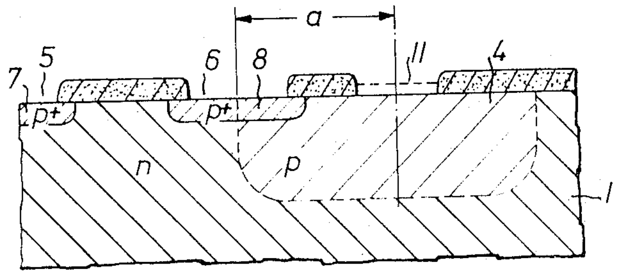
FIG. 4 is a view similar to that of FIG. 3 but showing a second stage of the method.

In FIG. 3, a semiconductor body 1 for example of silicon, is illustrated, into which the diodes and MOS field effect transistors of the integrated circuit have to be introduced. The basic semiconductor body is n-doped for example and covered, at the semiconductor surface, with a diffusion-inhibiting layer 2. A diffusion window 3 is introduced into this diffusion-inhibiting layer 2, which consists of silicon dioxide for example, in order to produce the first diode region. Impurities which produce a region 4 of p-type conductivity are then diffused into the basic semiconductor body through this window. The sheet resistance of this region amounts to about 300 ohm/square. The depth of penetration of the region 2 amounts to 5 μm. for example. The sheet resistance of the diode region 4 is selected so that, when the diode is stressed in the reverse direction, a lower field strength is obtained in the interior of the semiconductor body, so that the diode only breaks down at as high a reverse voltage as possible. For this reason, the doping of the diode region 4 is low so that a space region can easily spread therein.

After the production of the diode region 4, the oxide layer is again completed at the semiconductor surface. In the vicinity of the diffusion window 3, further diffusion windows 5 and 6, through which the necessary source and drain in regions for a MOS transistor are diffused into the semiconductor body, are formed in the masking layer as shown in FIG. 4. These regions 7 and 8 are preferably likewise produced by diffusion, the doping of these regions being so selected that the required electrical characteristics of the transistors are optimum. The geometrical relationships are so selected that the transistor region 8 which is to be connected electrically to the diode, penetrates into the diode region 4. The electrical connection between the diode and the transistor is established in the interior of the semiconductor body in this manner. The depth of penetration of the transistor regions amounts to 1 μm. for example. The distance *a* between the diffusion window bordering on the diode for one transistor region and the diffusion window for the second diode region, which still has to be introduced into the diode region 4, depends on the centering accuracy and the maximum extent of the space charge region in the region 4. In a preferred embodiment, the distance *a* between the centers of the diffusion windows 6 and 11 measured about 7.5 μm.

Figure 5:
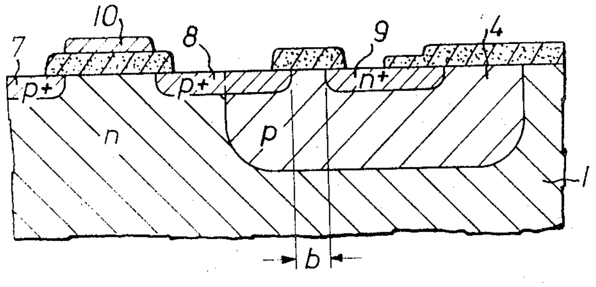
FIG. 5 is a view similar to that of FIG. 3 showing a third stage.

The region 9 of $n^+$-conductivity, which together with the region 4 forms the diode, is now diffused into the semiconductor body through the diffusion window 11 shown in FIG. 5. The indiffusion of this region is effected after the other diffusion windows for the transistors have been covered. The distance *b* between the regions 8 and 9 is determined by the extent of the space charge regions and amounts to 3 μm. for example.

The depth of penetration of the region 9 amounts to 1 μm. for example. A Schottky contact, which together with the region 4 of p-type conductivity forms a blocking metal-semiconductor junction, may also be fitted into the diffusion window 11 in order to produce the diode.

Finally, attention is drawn to the fact that the diode region 4 should be so doped that the breakdown voltage of the diode is of the order of magnitude of 15 volts or above.

It will be understood that the above description of the present invention is susceptible to various modifications changes and adaptations.

What is claimed is:

1. A method for producing an integrated solid state circuit including an MOS field effect transistor and a diode, comprising the steps of: forming in a semiconductor body of a first conductivity type a first diode region of a second conductivity type, said step of forming being carried out in such a manner that the specific resistance of said first diode region will provide the resulting diode with a high breakdown voltage; forming within said body, after said step of forming the first diode region, source and drain regions of the field effect transistor of the second conductivity type with a selected doping, said step of forming the source and drain regions being carried out so that one of said regions of the transistor extends into the first diode region to connect the transistor with the diode through these regions; and forming a region of material in direct contact with said first diode region so that a rectifying junction is created between said region of material and said first diode region.

2. A method as defined in claim 1, wherein said step of forming a region of material in contact with said diode region comprises introducing into said diode region doping particles of a first conductivity type for forming a further diode region which is heavily doped.

3. A method as defined in claim 2, wherein the depth of penetration of said diode region amounts to about 5 μm. while that of said other diode region amounts to about 1 μm.

4. A method as defined in claim 1, wherein said step of forming a region of material in contact with said diode region comprises providing said diode region with a Schottky contact.

5. A method as defined in claim 1, wherein said regions are produced by an indiffusion of impurities.

6. A method as defined in claim 1 wherein the sheet resistance of the first diode region amounts to about 300 ohm/square.

7. A method as defined in claim 1, wherein said first diode region is doped to provide a breakdown voltage of said diode higher than 15 volts.

References Cited

UNITED STATES PATENTS

| | | | |
|---|---|---|---|
| 3,408,543 | 10/1968 | Ono et al. | 317—235 B |
| 3,543,052 | 11/1970 | Kahng | 317—235 G X |
| 3,577,005 | 5/1971 | Christensen | 317—235 G X |
| 3,434,023 | 3/1969 | Lesk | 317—234 R |

FOREIGN PATENTS

| | | | |
|---|---|---|---|
| 1,131,675 | 12/1968 | Great Britain | 317—235 G |

GEORGE T. OZAKI, Primary Examiner

U.S. Cl. X.R.

148—187, 189; 317—235 R